US007858488B2

(12) United States Patent
Shim

(10) Patent No.: US 7,858,488 B2
(45) Date of Patent: Dec. 28, 2010

(54) METHOD OF FORMING A DEVICE ISOLATION FILM OF A SEMICONDUCTOR DEVICE

(75) Inventor: Cheon Man Shim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 538 days.

(21) Appl. No.: 11/872,178

(22) Filed: Oct. 15, 2007

(65) Prior Publication Data

US 2008/0160715 A1    Jul. 3, 2008

(30) Foreign Application Priority Data

Dec. 29, 2006    (KR) .................. 10-2006-0137333

(51) Int. Cl.
   *H01L 21/76* (2006.01)
(52) U.S. Cl. .................. 438/424; 438/400; 257/E21.54
(58) Field of Classification Search .................. 438/424; 257/E21.54
   See application file for complete search history.

(56) References Cited

U.S. PATENT DOCUMENTS

| | | | | |
|---|---|---|---|---|
| 4,857,477 A * | 8/1989 | Kanamori | .................. | 438/386 |
| 5,700,712 A * | 12/1997 | Schwalke | .................. | 438/430 |
| 5,843,846 A * | 12/1998 | Nguyen et al. | .............. | 438/713 |
| 5,933,749 A * | 8/1999 | Lee | .............. | 438/435 |
| 5,976,948 A * | 11/1999 | Werner et al. | ............... | 438/424 |
| 6,261,921 B1 * | 7/2001 | Yen et al. | ..................... | 438/424 |
| 6,500,727 B1 * | 12/2002 | Chen et al. | .................. | 438/424 |
| 6,511,902 B1 * | 1/2003 | Liang et al. | ................. | 438/620 |
| 6,828,248 B1 * | 12/2004 | Tao et al. | .................... | 438/711 |
| 2004/0079632 A1 * | 4/2004 | Ahmad et al. | ........... | 204/192.3 |
| 2005/0042819 A1 * | 2/2005 | Hao et al. | ................... | 438/248 |
| 2009/0239352 A1 * | 9/2009 | Kitagawa et al. | ........... | 438/439 |

FOREIGN PATENT DOCUMENTS

KR    1020060001311    1/2006

* cited by examiner

*Primary Examiner*—Charles D Garber
*Assistant Examiner*—Angel Roman
(74) *Attorney, Agent, or Firm*—Workman Nydegger

(57) ABSTRACT

A method of forming a device isolation film for a semiconductor device comprising forming a trench on a silicon semiconductor substrate, rounding an upper corner of the trench using an in-situ plasma method, filling the trench by forming an insulating layer over the silicon semiconductor substrate, and forming a shallow trench isolation area by performing a planarization process on the insulating layer so as to expose the silicon semiconductor substrate.

3 Claims, 3 Drawing Sheets

METHOD OF FORMING A DEVICE ISOLATION FILM OF A SEMICONDUCTOR DEVICE

CROSS-REFERENCE TO RELATED APPLICATIONS

This application claims the benefit of Korean Patent Application No. 10-2006-0137333, filed on Dec. 29, 2006, which is hereby incorporated by reference in its entirety.

BACKGROUND OF THE INVENTION

1. Field of the Invention

The present invention relates a method of forming a device isolation film in a semiconductor device. More particularly, the present invention relates to a method of forming a device isolation film in a semiconductor device which prevents gaps and voids from forming in the device isolation film of the semiconductor device.

2. Discussion of the Related Art

In highly integrated semiconductor devices with less than 90 nm processes, the width of the gates and the width of the transistor is so narrow that the depth of the trenches are deeper than the depth at a junction the source and drain so as to electrically isolate the areas in the devices.

One method of electrically isolating the areas in the semiconductor devices known in the art is the local oxidation of silicon (LOCOS) method, wherein the silicon substrate is recessed and an insulating layer is grown wherein a shallow trench isolation method is used to etch the silicon substrate in a vertical direction and cover it with the insulating material.

FIG. 1 is a cross-sectional view illustrating the LOCOS method for forming a device isolation film of a semiconductor device according to the related art. As shown in FIG. 1, an insulating layer is formed on a semiconductor substrate. Next, a photoresist pattern is formed on the insulating layer by coating a photoresist material. Then, an etching process is performed using the photoresist pattern to form a series of trenches in the semiconductor substrate. Later, an ashing and cleaning process is performed to remove the photoresist pattern and the trench is filled by depositing the insulating layer over the semiconductor substrate and the trench. Then, a planarization process is performed using a chemical mechanical polishing (CMP) method in order to form a shallow trench isolation (STI).

One difficulty in the process, however, illustrated in FIG. 1, is that the upper corners (A) of the trenches in the semiconductor device are narrow, making it difficult to successfully form the insulating layer with a high density plasma chemical vapor deposition (HDPCVD) apparatus without forming gaps or voids in the insulating layer formed in the trenches.

BRIEF SUMMARY OF THE INVENTION

The present invention proposes to solve previously mentioned problems of the related art by providing a method of forming a device isolation film for a semiconductor device which prevents voids of material from being formed in during the formation of the device isolation film in the semiconductor device.

In order to accomplish the foregoing objects, one aspect of the invention is a method of forming a device isolation film in a semiconductor device comprising forming a trench on a silicon semiconductor substrate, rounding the upper corner of the trench using an in-situ plasma process, filling the trench by forming an insulating layer over the silicon semiconductor substrate, and forming a shallow trench isolation are by performing a planarization process on the insulating layer so as to expose the silicon semiconductor substrate.

A second aspect of the invention is a method of forming a device isolation film for a semiconductor device comprising forming a silicon oxide film on the silicon semiconductor substrate, forming a photoresist pattern on the surface of the silicon substrate, forming a trench in the semiconductor substrate by selectively etching the silicon oxide film and the silicon semiconductor substrate using the photoresist pattern as a mask in an etching process, rounding an upper corner of the silicon oxide film in the trench using an in-situ plasma process, filling the trench by depositing an insulating layer over the silicon semiconductor substrate, and forming a shallow trench isolation area by performing a planarization process on the insulating layer so as to expose the silicon semiconductor substrate.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
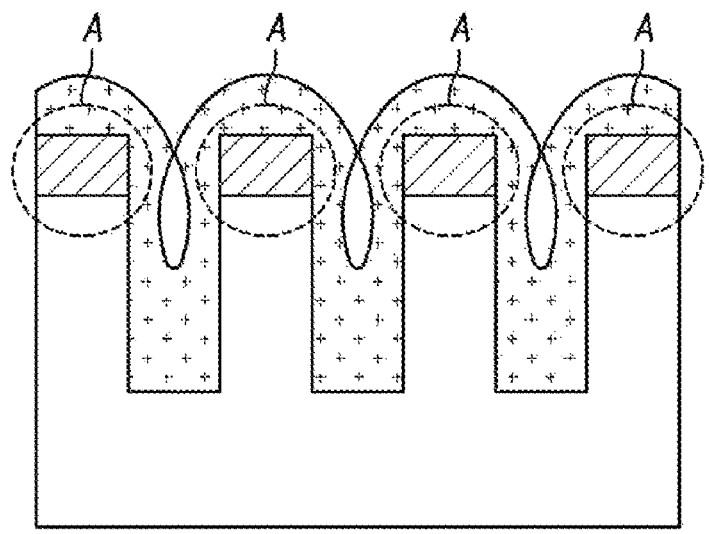
FIG. 1 is a cross-sectional view illustrating a method of forming a device isolation film of a semiconductor device known in the present art.

Hereinafter, a preferred embodiment of the invention will be described using an example of a method for manufacturing a semiconductor device which is an image sensor will be described with reference to the accompanying drawings. Other objects, features, and advantages of the present invention will be apparent from the detailed description of the embodiments in conjunction with the accompanying drawings.

Hereinafter, while the constitution and effect of embodiments of the present invention will be described with reference to the accompanying drawings, the embodiment shown in the drawings and described with reference comprises only one embodiment of the invention and therefore, the technical idea, core constitution, and effect of the present invention are not limited thereto.

FIGS. 2A to 2D are cross-sectional views illustrating a method of forming a device isolation film in a semiconductor device according to the present invention.

Figure 2A:
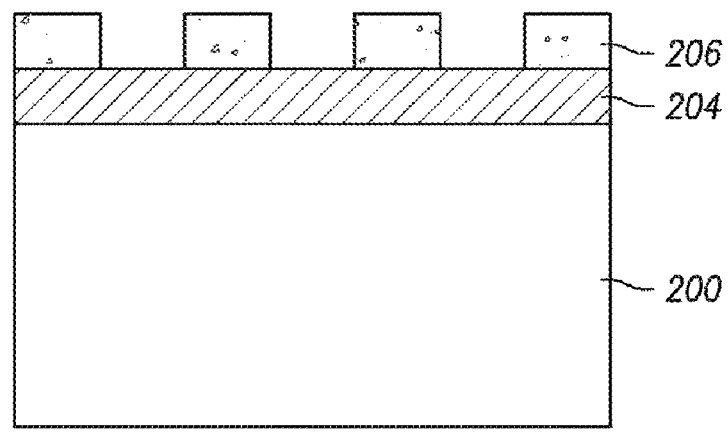
FIGS. 2A to 2D are cross-sectional views illustrating a method of forming a device isolation film for a semiconductor device according to the present invention.

First, as shown in FIG. 2A, a silicon oxide film 204 is formed on a silicon semiconductor substrate 200. Next, a photoresist pattern 206 is formed by coating the silicon oxide film 204 with a photoresist material which is formed into a pattern. In this example, the silicon oxide film 204 can be formed using FSG or SiH4.

Figure 2B:
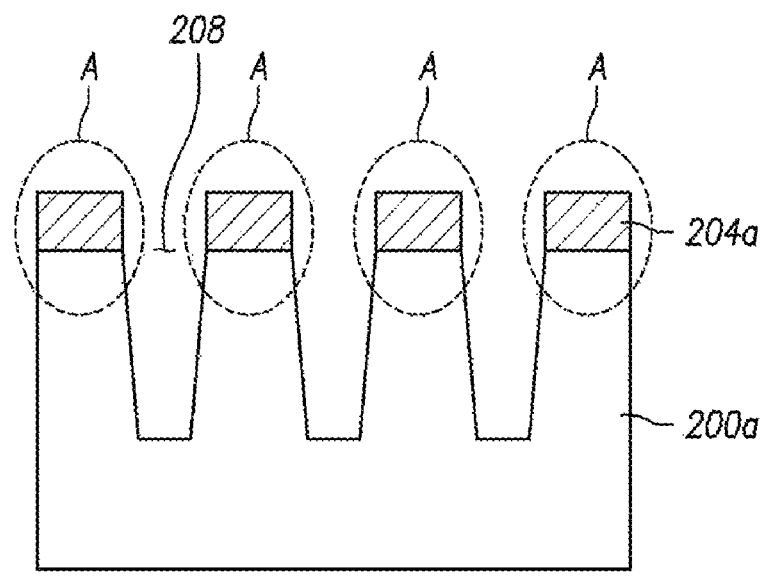

As shown in FIG. 2B, an etching process is performed using the photoresist pattern 206 so as to selectively etch the silicon oxide film 204 and the silicon semiconductor substrate 200. During this process, a series of trenches 208 are formed in the silicon substrate 200. Next, an ashing and cleaning processes is performed so as to remove the photoresist pattern 206.

Figure 2C:
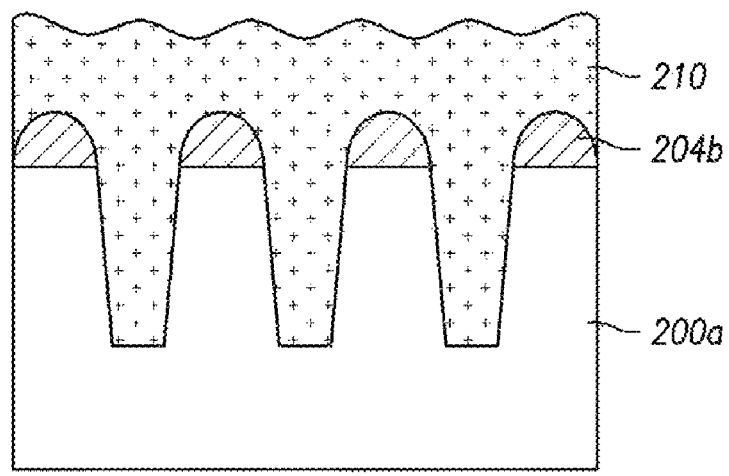

As shown in FIGS. 2B and 2C, the upper corner A of the trench 208 in the silicon semiconductor substrate 200a, or more specifically, the corner A of the silicon oxide pattern 204a shown in FIG. 2B is rounded by means of an in-situ plasma process. The in-situ plasma process is performed using a predetermined gas capable of supplying top power of between 2000 W and 5000 W, side power of between 2000 W and 5000 W, and bias power of between 500 W and 5000 W. In this example, the predetermined gas is at least one of O2, He, Ar, H, NF3 and B2H6 at a flow rate of between 10 sccm and 1000 sccm.

Using this process, the upper corner A of the trench is rounded so as to reduce the angle of the corner, making it easier to fill the area of the trench with the insulating layer without leaving any bubbles, gaps or voids.

Next, an insulating layer 210 is deposited over the silicon semiconductor substrate 200, including the area in the trench 208 using a high density plasma process, so as to fill the trench 208.

Figure 2D:
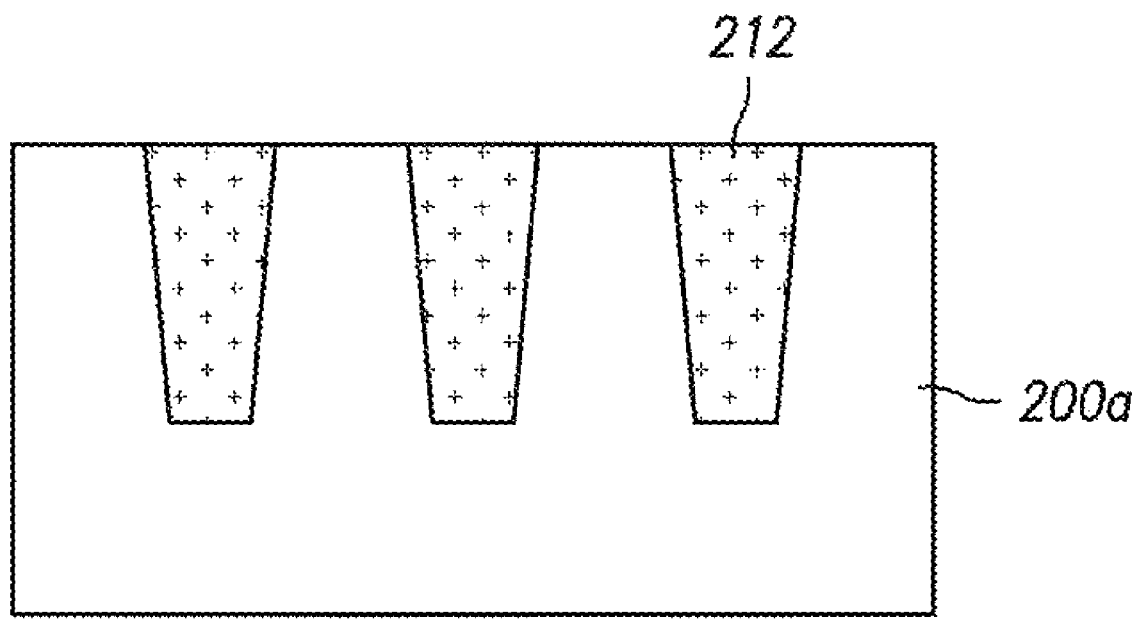

Then, as shown in FIG. 2D, a planarization process is performed on the insulating layer 210 using a chemical mechanical polishing (CMP) process so as to expose the semiconductor substrate pattern 200a, thereby forming a shallow trench isolation area (STI) 212.

Although the preferable embodiments of the present invention have been described above, the present invention can be implemented in a variety of modified forms without departing from the essential elements or scope of the present invention. Therefore, the embodiment of the present invention described herein should be considered as one illustration of the invention, rather than as a limitation. The scope of the present invention is shown in the claims, rather than the above description, and all differences present within equivalents should be construed as included in the present invention.

As described above, the upper corner of the trench in the semiconductor substrate is rounded using a in-situ plasma process so as to provide a method of forming the device isolation film in the semiconductor device without gaps or voids in the isolation film, making it possible to prevent current leakage and the deterioration of the electrical characteristics of the semiconductor device.

What is claimed is:

1. A method of forming a device isolation film for a semiconductor device, the method comprising:
    forming a silicon oxide film on a silicon semiconductor substrate;
    forming a photoresist pattern on the surface of the silicon oxide film;
    forming a trench in the semiconductor substrate by selectively etching the silicon oxide film and the silicon semiconductor substrate using the photoresist pattern as a mask in an etching process;
    rounding an upper corner of the silicon oxide film without rounding an upper corner of the silicon semiconductor substrate by using an in-situ plasma process;
    filling the trench by depositing an insulating layer over the silicon semiconductor substrate; and
    forming a shallow trench isolation area by performing a planarization process on the insulating layer so as to expose the silicon semiconductor substrate and remove the silicon oxide film having the rounded upper corner.

2. The method according to claim 1, wherein the in-situ plasma method uses a gas capable of supplying a top power of between 2000 W and 5000 W, a side power of between 2000 W and 5000 W, and a bias power of between 500 W and 5000 W.

3. The method according to claim 2, wherein the gas comprises a gas selected from the group of O2, He, Ar, H, NF3 and B2H6, with a flow rate of between 10 sccm and 1000 sccm.

* * * * *